United States Patent
Aritome et al.

(10) Patent No.: US 7,889,561 B2
(45) Date of Patent: Feb. 15, 2011

(54) READ OPERATION FOR NAND MEMORY

(75) Inventors: Seiichi Aritome, Boise, ID (US); Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/582,289

(22) Filed: Oct. 20, 2009

(65) Prior Publication Data

US 2010/0039862 A1 Feb. 18, 2010

Related U.S. Application Data

(63) Continuation of application No. 11/407,227, filed on Apr. 19, 2006, now Pat. No. 7,606,075.

(51) Int. Cl.
G11C 11/34 (2006.01)
G11C 16/04 (2006.01)

(52) U.S. Cl. ............ 365/185.18; 365/185.17; 365/185.25; 365/203

(58) Field of Classification Search ............ 365/185.17, 365/185.18, 185.25, 185.33, 203
See application file for complete search history.

(56) References Cited

U.S. PATENT DOCUMENTS

| | | | |
|---|---|---|---|
| 5,570,315 A | 10/1996 | Tanaka et al. |
| 5,659,505 A | 8/1997 | Kobayashi et al. |
| 5,677,875 A | 10/1997 | Yamagata et al. |
| 6,191,445 B1 | 2/2001 | Fujiwara |
| 6,327,182 B1 | 12/2001 | Shum et al. |
| 6,477,089 B2 | 11/2002 | Takeda et al. |
| 6,859,394 B2 | 2/2005 | Matsunaga et al. |
| 6,859,397 B2 | 2/2005 | Lutze et al. |
| 6,872,614 B2 | 3/2005 | Fujiwara |
| 6,873,561 B2 | 3/2005 | Ooishi |
| 6,996,024 B2 | 2/2006 | Tanzawa et al. |
| 2003/0053334 A1 | 3/2003 | Chen |
| 2004/0057287 A1 | 3/2004 | Cernea et al. |
| 2005/0265079 A1 | 12/2005 | Shirota |
| 2006/0023497 A1 | 2/2006 | Kawazoe et al. |

Primary Examiner—Richard Elms
Assistant Examiner—Harry W Byrne
(74) Attorney, Agent, or Firm—Leffert Jay & Polglaze, P.A.

(57) ABSTRACT

Non-volatile memory devices utilizing a NAND architecture are adapted to perform read operations where a first potential is supplied to a source line selectively coupled to a bit line through a string of series-coupled non-volatile memory cells containing a memory cell targeted for reading, and where a second, different, potential is supplied to other source lines selectively coupled to the bit line through other strings of series-coupled non-volatile memory cells not containing the target memory cell. Supplying a different potential to the other source lines facilitates mitigation of current leakage between the other source lines and the bit line while sensing a data value of the target memory cell.

24 Claims, 6 Drawing Sheets

READ OPERATION FOR NAND MEMORY

RELATED APPLICATION

This application is a Continuation of U.S. application Ser. No. 11/407,227, titled "READ OPERATION FOR NAND MEMORY," filed Apr. 19, 2006, now U.S. Pat. No. 7,606,075 which is commonly assigned and incorporated herein by reference.

TECHNICAL FIELD

The present invention relates generally to semiconductor memory devices, and in particular, the present invention relates to read operations for memory devices having a NAND architecture.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, cellular telephones and removable memory modules.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

As the performance of electronic systems employing flash memory devices increases, flash memory device performance should also increase. A performance increase includes reducing power consumption, increasing speed, and increasing the memory density. One way to accomplish these tasks is by decreasing the size of the memory array and its individual devices.

Unfortunately, there can be resulting problems with decreasing device sizes. For example, as the channel length and gate oxide thickness are reduced in a field-effect transistor, leakage current generally increases. In a NAND architecture memory device, current leakage during read operations can be substantial as thousands of blocks of memory cells are typically coupled to each bit line.

For the reasons stated above, and for other reasons stated below which will become apparent to those skilled in the art upon reading and understanding the present specification, there is a need in the art for alternative read operations for NAND memory architectures.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

Figure 1:
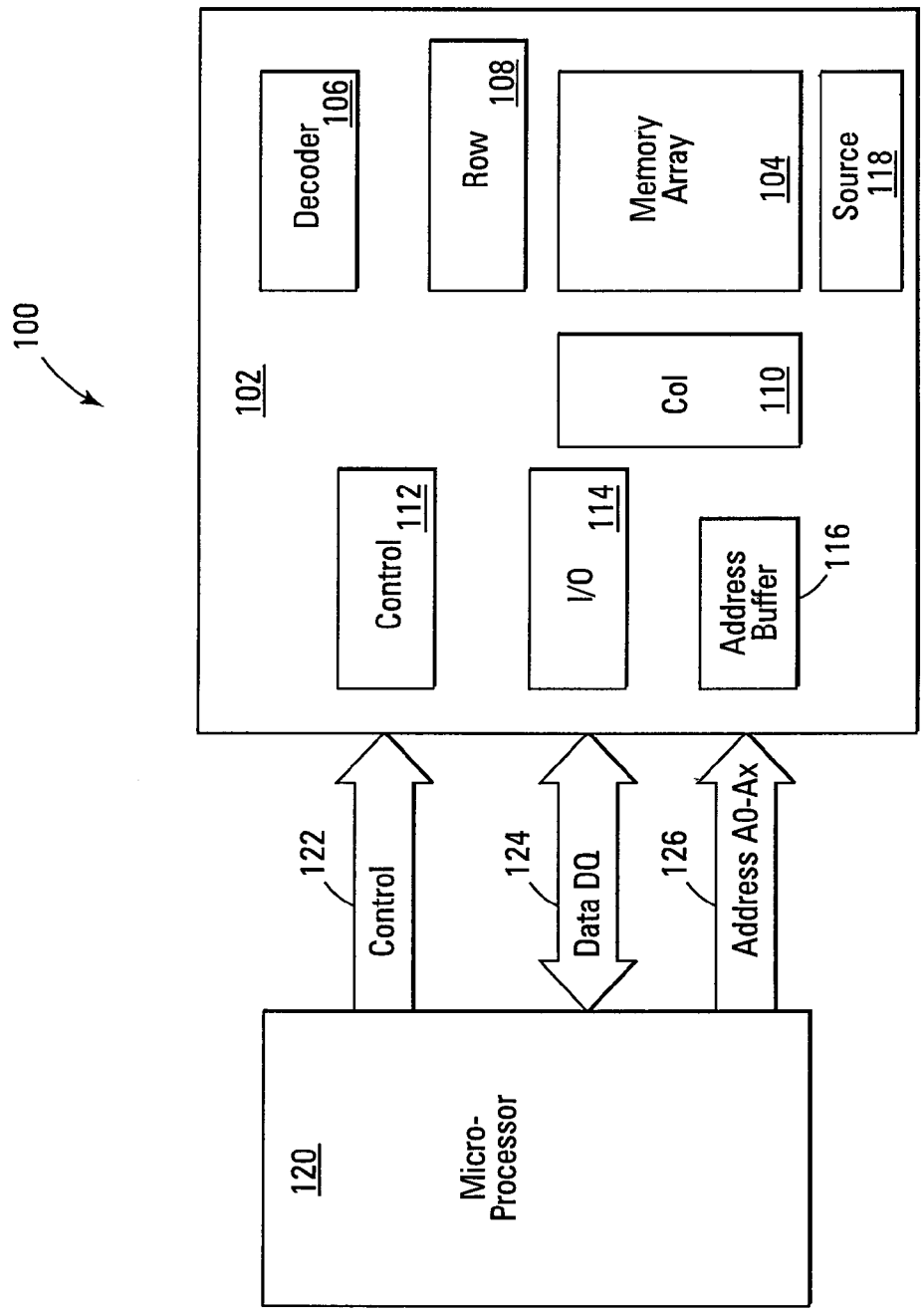
FIG. 1 is a functional block diagram of a electronic system having at least one memory device in accordance with an embodiment of the invention.

FIG. 1 is a simplified block diagram of an electronic system 100, according to an embodiment of the invention. Electronic system 100 includes a non-volatile memory device 102 that includes an array of non-volatile memory cells 104, an address decoder 106, row access circuitry 108, column access circuitry 110, control circuitry 112, Input/Output (I/O) circuitry 114, and an address buffer 116. The control circuitry 112 is adapted to perform methods in accordance with embodiments of the invention. The memory device 102 further includes source access circuitry 118 for selectively applying variable potentials to two or more source lines (not shown in FIG. 1) of the array of non-volatile memory cells 104 in accordance with embodiments of the invention. The memory cells (not shown in FIG. 1) of the array of non-volatile memory cells 104 may be, for example, floating-gate memory cells, floating-node memory cells or other non-volatile memory cells capable of defining data values by changes in threshold voltage.

Electronic system 100 includes an external processor 120, e.g., a memory controller or host processor, electrically connected to memory device 102 for memory accessing. The memory device 102 receives control signals from the processor 120 over a control link 122. The memory cells are used to store data that are accessed via a data (DQ) link 124. Address signals are received via an address link 126 that are decoded at address decoder 106 to access the memory array 104 and selectively apply source potentials. Address buffer circuit 116 latches the address signals. The memory cells are accessed in response to the control signals and the address signals. The control link 122, data link 124 and address link 126 can be collectively referred to as access lines. It will be appreciated by those skilled in the art that additional circuitry and control signals can be provided, and that the memory device of FIG. 1 has been simplified to help focus on the invention.

Figure 2:
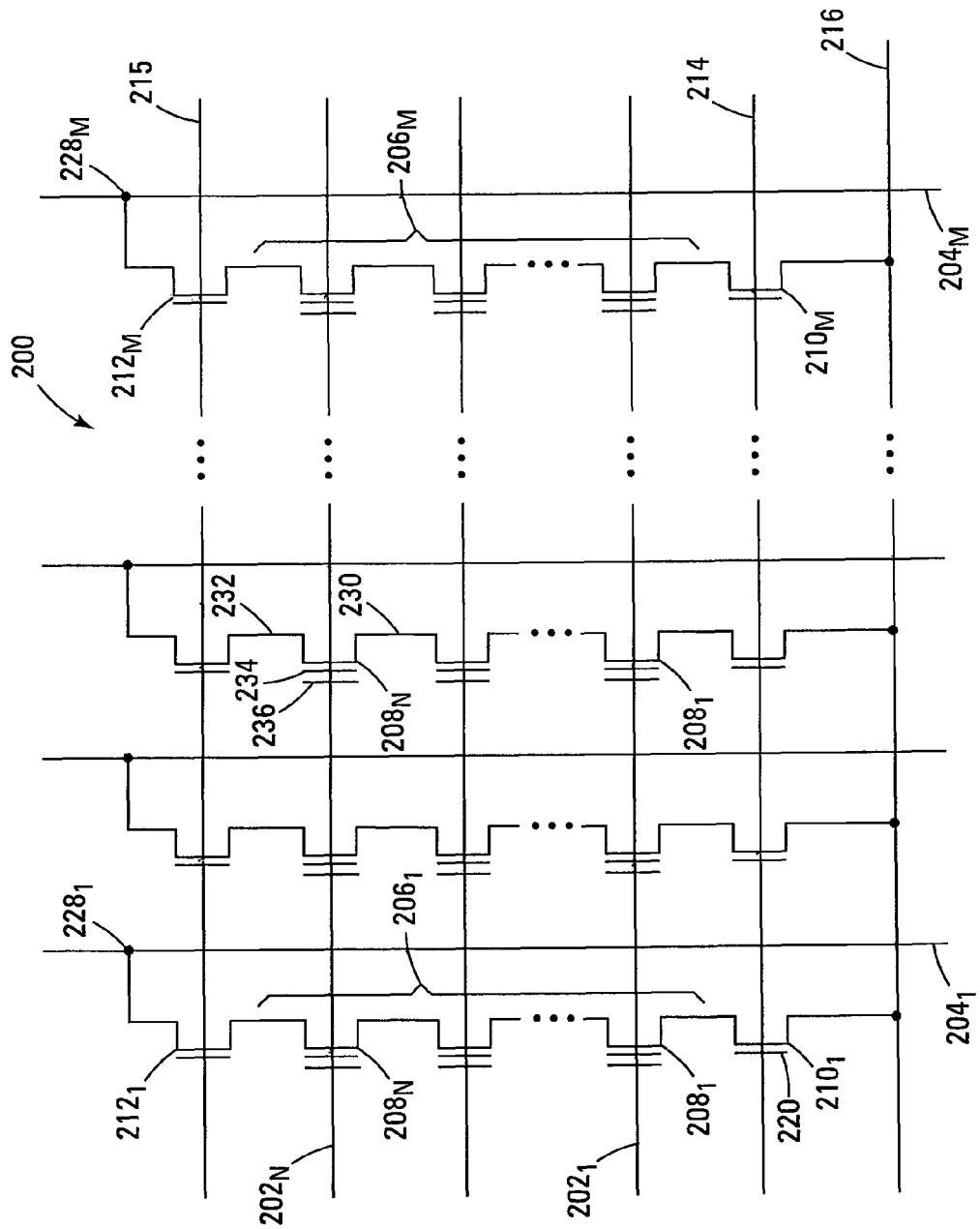
FIG. 2 is a schematic of a portion of a NAND memory array in accordance with an embodiment of the invention.

FIG. 2 is a schematic of a portion of a NAND memory array 200 as a portion of memory array 104 of FIG. 1 in accordance with a further embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a local bit line 204. The transistors 208, depicted as floating-gate transistors in FIG. 2, represent non-volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the invention, such as NROM, magnetic or ferroelectric transistors and other transistors capable of being programmed to assume one of two or more data states.

To read memory cells in a NAND architecture memory array, unselected word lines of a block of memory cells are typically operated as pass gates while a selected word line receives a different control potential to allow its data state to determine the conductance of its associated strings of memory cells. In general, a word line associated with a selected row of memory cells is driven at a selected read level voltage, which is typically a low voltage (such as 0V or a ground potential). In addition, the word lines connected to the gates of the unselected memory cells of each string are driven by a read pass voltage (such as 4.5V) to operate the unselected memory cells of each string as pass gates. This allows them to pass current in a manner that is unrestricted by their stored data values. In a read operation, current then flows from the column bit line to the source line through each series-connected string, restricted only by the memory cell selected to be read in each string. The data value of a selected memory cell of a string is then determined by sensing a level of current flow through its associated string.

Figure 3:
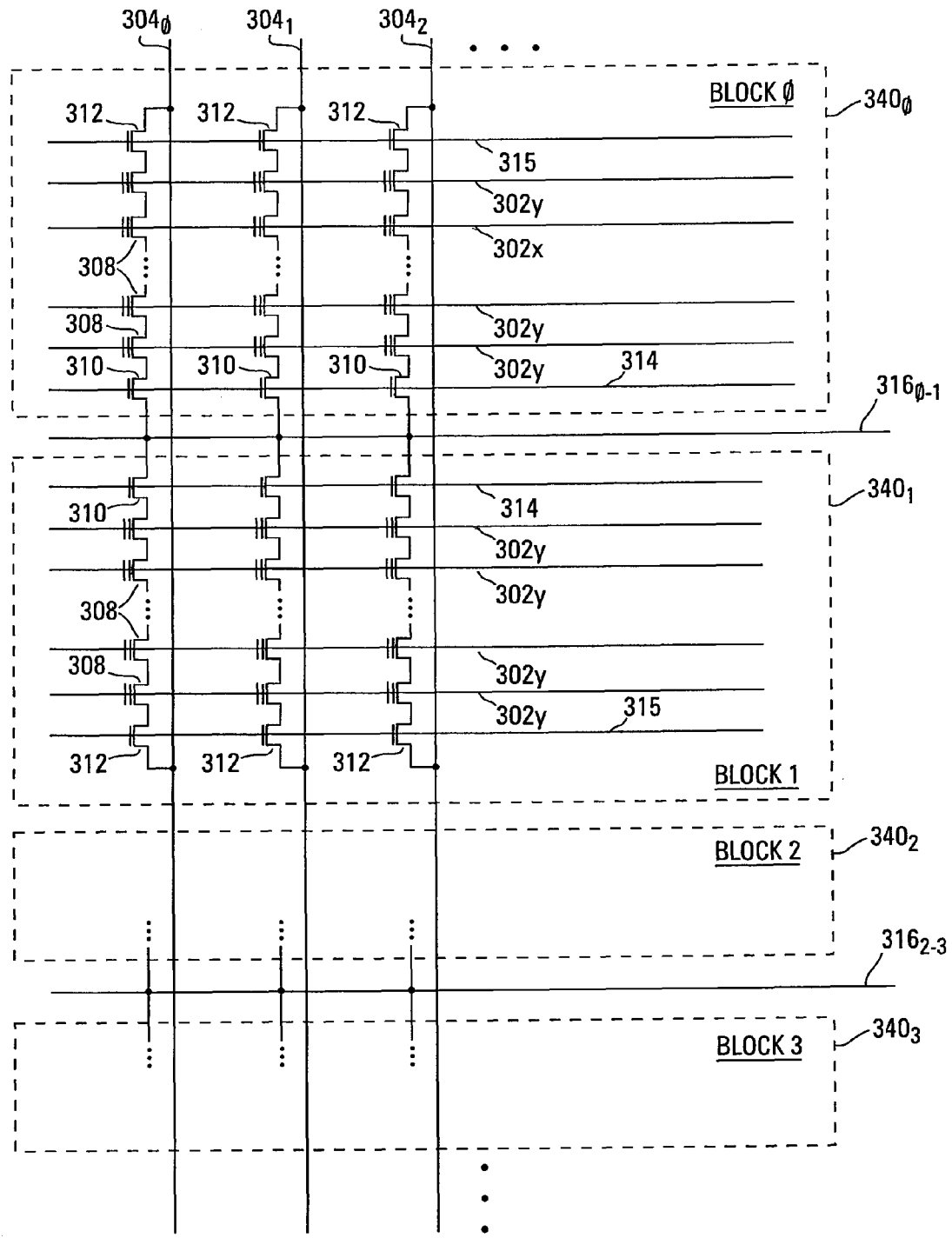
FIG. 3 is a schematic of a portion of a NAND memory array showing block architecture in accordance with a further embodiment of the invention.

By varying potentials applied to source lines depending upon their association with a selected block of memory cells, leakage current during read operations can be mitigated. FIG. 3 is a schematic of a portion of a NAND memory array 300 as a portion of memory array 104 of FIG. 1 showing block architecture as might be used with an embodiment of the invention. The level of detail depicted in FIG. 3 is simplified to better focus on the read operations of the various embodiments. However, the elements of the array 300 are substantially as described with reference to FIG. 2. As shown in FIG. 3, the memory array 300 is organized into blocks of memory cells 340. Four blocks of memory cells, i.e., $340_0$, $340_1$, $340_2$ and $340_3$, are depicted in FIG. 3. While fewer blocks could be defined, typical memory arrays contain substantially greater numbers of blocks. Each block 340 is depicted to include three bit lines $304_0$, $304_1$ and $304_2$. While fewer bit lines could be defined, typical memory blocks contain substantially greater numbers of bit lines. Each block 340 includes one string of memory cells 308 coupled to each of its bit lines 304, and with each of the strings of memory cells coupled to a source line 316. Although not required, adjacent blocks 340 may share a source line 316. For example, blocks $340_0$ and $340_1$ may share source line $316_{0-1}$, blocks $340_2$ and $340_3$ may share source line $316_{2-3}$, and so on. Each source select gate 310 or SGS is located at an intersection of a bit line 304 and a source select line 314, while each drain select gate 312 or SGD is located at an intersection of a bit line 304 and a drain select line 315. Although depicted to include only one source select gate 310 and one drain select gate 312, each string of memory cells 308 may include multiple select gates as described with reference to FIG. 2.

To read a selected row of memory cells of the memory array 300, the word line of the selected row, e.g., word line 302x, receives a read voltage to activate its memory cells if they have a first data value, such as a logic 1, and to leave its memory cells deactivated if they have a second data value, such as logic 0. For example, the word line 302x might receive the ground potential Vss or 0V. Alternatively, the read voltage may be some value above Vss, such as 0.2V. Other voltages could be used provided they would activate a memory cell having a first data value and not activate a memory cell having a second data value. The word line 302x supplies the read voltage to the control gates of each of its memory cells 308 of its associated block $340_0$. Remaining word lines 302y not containing a selected memory cell 308 may receive a pass voltage to act as pass gates, i.e., activating their memory cells 308 regardless of their data values. For one embodiment, unselected word lines 302y may receive approximately 4.5V. Other voltages could be used provided they would activate each memory cell 308 without regard to its data value.

For one embodiment, selected bit lines 304 would receive a bit line voltage while unselected bit lines 304 would receive a ground potential. For example, the selected bit lines 304, i.e., those associated with a string of memory cells 308 containing a memory cell targeted for reading, might receive 1.0V while unselected bit lines 304 might receive the ground potential Vss. The source line $316_{0-1}$ associated with the selected row, i.e., 302x in this example, would receive the ground potential. Source select gates 310 and drain select gates 312 associated with a selected word line 302x, i.e., those of block $340_0$, would receive control gate voltages sufficient to activate these select gates. Source select gates 310 and drain select gates 312 of remaining blocks $340_1$, $340_2$, $340_3$, etc., would receive control gate voltages to deactivate these select gates. For one embodiment, source select line 314 and drain select line 315 of block $340_0$ would receive the supply potential Vcc while source select lines 314 and drain select lines 315 of blocks $340_1$, $340_2$, $340_3$, etc. would receive the ground potential Vss. Although specific voltages were described in relation to reading memory cells of the array 300, it is noted that other combinations of voltages may be used to place a data value of a targeted memory cell on a bit line and the invention is not limited to specific voltages levels on the various nodes.

In these types of read operations, strings of memory cells coupled to selected bit lines but not containing a targeted memory cell can leak current from the bit line to their associated source line 316. This is true even though their select gates are not activated. However, because each selected bit line typically has a vast number of strings of memory cells selectively coupled to it, small amounts of leakage from a number of these strings could disturb the accuracy of the read operation by indicating current flow from the selected bit line even if the memory cell coupled to the selected word line is deactivated.

For the various embodiments, this potential leakage from a selected bit line 304 is mitigated by altering the voltage on source lines 316 not associated with the selected word line 302x. For one embodiment, while source line $316_{0-1}$ associated with the selected word line 302x might receive 0V, source line $316_{2-3}$ and other source lines 316 not associated with the selected word line 302x would receive a voltage level that is between the potential on source line $316_{0-1}$ and the potential on a selected bit line 304. For a further embodiment, source line $316_{2-3}$ and other source lines 316 not associated with the selected word line 302x would receive the same potential as a selected bit line 304. In this manner, unintentional leakage between an unselected source line 316 and a selected bit line 304 is reduced and potentially eliminated by reducing or eliminating the voltage differential between the unselected source line 316 and the selected bit line 304.

In reading a target memory cell, sensing devices may look for a voltage drop on the selected bit line. For example, the selected bit line may be precharged to a bit line voltage, such as 1.0V. When the read voltage is applied to the selected word line and pass voltages are applied to remaining word lines of a string of memory cells, the bit line will lose charge, and thus voltage, if the target memory cell is activated, but the bit line will maintain its charge if the target memory cell remains deactivated. The data value of the target memory cell is sensed some time after applying the read voltage by looking at the voltage of the bit line. The target memory cell is deemed to have a first data value if the bit line falls below some predetermined voltage, e.g., 0.2V, but a second data value if the bit line voltage is higher than the predetermined voltage. For one embodiment, the potential applied to the unselected source lines 316 is greater than or equal to the predetermined sensing voltage. For a further embodiment, the potential applied to the unselected source lines 316 is less than or equal to the selected bit line voltage. For a still further embodiment, the potential applied to the unselected source lines 316 has a value closer to the predetermined sensing voltage than to the selected bit line voltage. By choosing a voltage greater than the predetermined sensing voltage, leakage through unselected strings of memory cells substantially cannot produce a false indication of an erased target memory cell. In addition, by choosing a voltage close to the predetermined sensing voltage, the likelihood of current leakage from unselected source lines to the selected bit line overcoming the current drain through an erased target memory cell is reduced.

For a further embodiment, the unselected source lines are precharged to their voltage level described above, and then permitted to float. In this manner, any propensity for current leakage between an unselected source line and the selected bit line would be reduced as such unselected source lines begin to equilibrate with the selected bit line, thus reducing any contribution they might have.

The determination of which source lines should receive a potential associated with a read operation and which source lines should receive a potential intended to mitigate leakage is performed by source access circuitry and based on whether a source line is associated with a word line receiving a read voltage or not, respectively. For example, where blocks of memory cells are associated with source lines in a one-to-one relationship, a source line is selected if any memory cell in its block is targeted. In the example architecture of FIG. 3, a source line is selected if any memory cell in either of its associated blocks is targeted. As used herein, an element is selected if it is associated with a memory cell targeted to be read. For example, a word line is selected if it acts as a control gate of the target memory cell. A bit line is selected if it is selectively coupled to a string of memory cells containing the target memory cell. And a source line is selected if it is selectively coupled to a string of memory cells containing the target memory cell. All other word lines, bit lines and source lines would be unselected.

Figure 4:
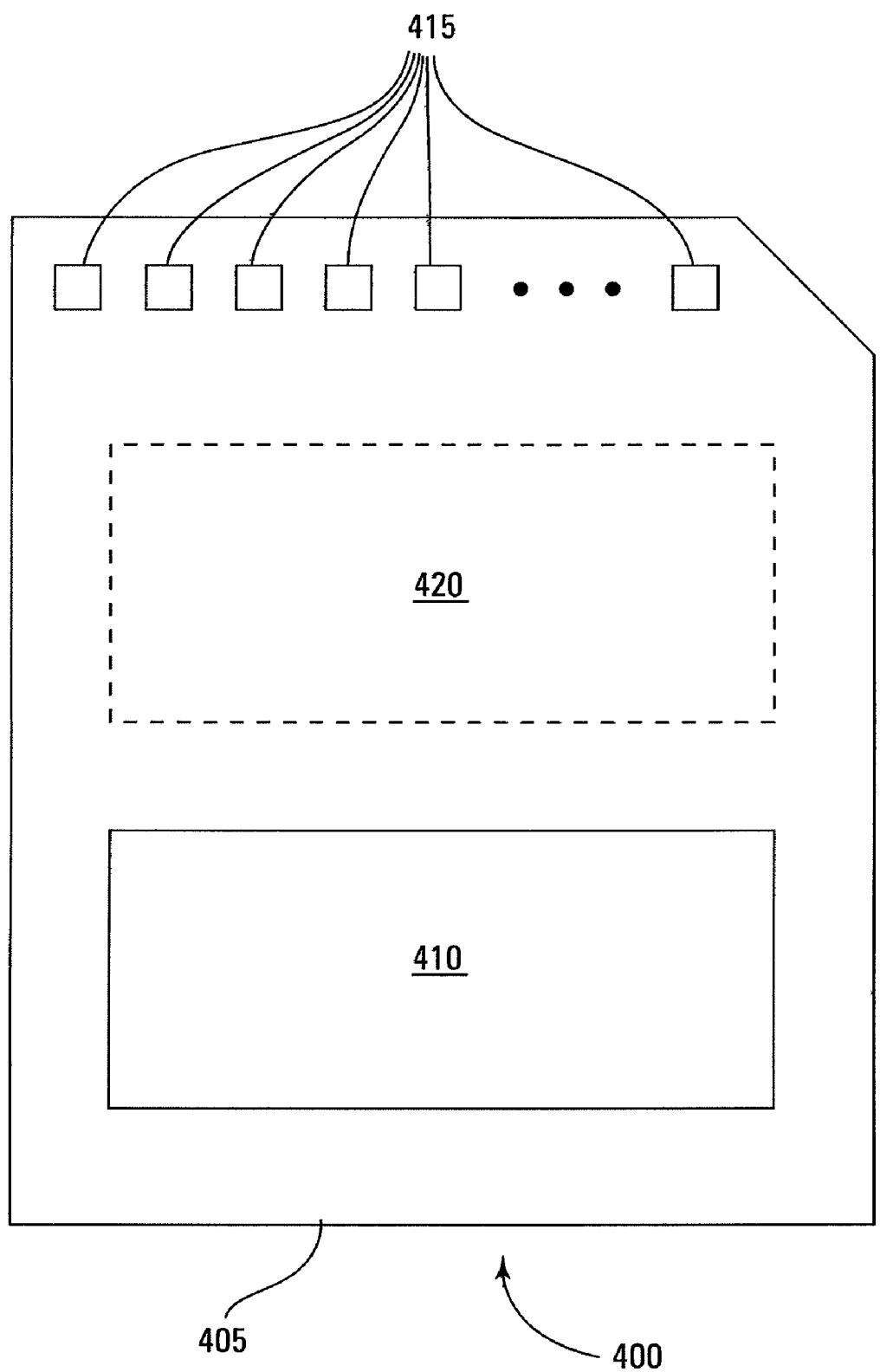
FIG. 4 is a functional block diagram of a memory module having at least one memory device in accordance with an embodiment of the invention.

FIG. 4 is an illustration of an exemplary memory module 400. Memory module 400 is illustrated as a memory card, although the concepts discussed with reference to memory module 400 are applicable to other types of removable or portable memory, e.g., USB flash drives, and are intended to be within the scope of "memory module" as used herein. In addition, although one example form factor is depicted in FIG. 4, these concepts are applicable to other form factors as well.

In some embodiments, memory module 400 will include a housing 405 (as depicted) to enclose one or more memory devices 410, though such a housing is not essential to all devices or device applications. At least one memory device 410 is a non-volatile memory adapted to perform methods of selectively applying differing voltages to source lines in accordance with embodiments of the invention. Where present, the housing 405 includes one or more contacts 415 for communication with a host device. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. For some embodiments, the contacts 415 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 415 provide an interface for passing control, address and/or data signals between the memory module 400 and a host having compatible receptors for the contacts 415.

The memory module 400 may optionally include additional circuitry 420 which may be one or more integrated circuits and/or discrete components. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command sequences received from a host into the appropriate command sequences to achieve the desired access to the memory device 410. Such translation may further include changes in signal voltage levels in addition to command sequences.

The additional circuitry 420 may further include functionality unrelated to control of a memory device 410 such as logic functions as might be performed by an ASIC (application specific integrated circuit). Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

Figure 5:
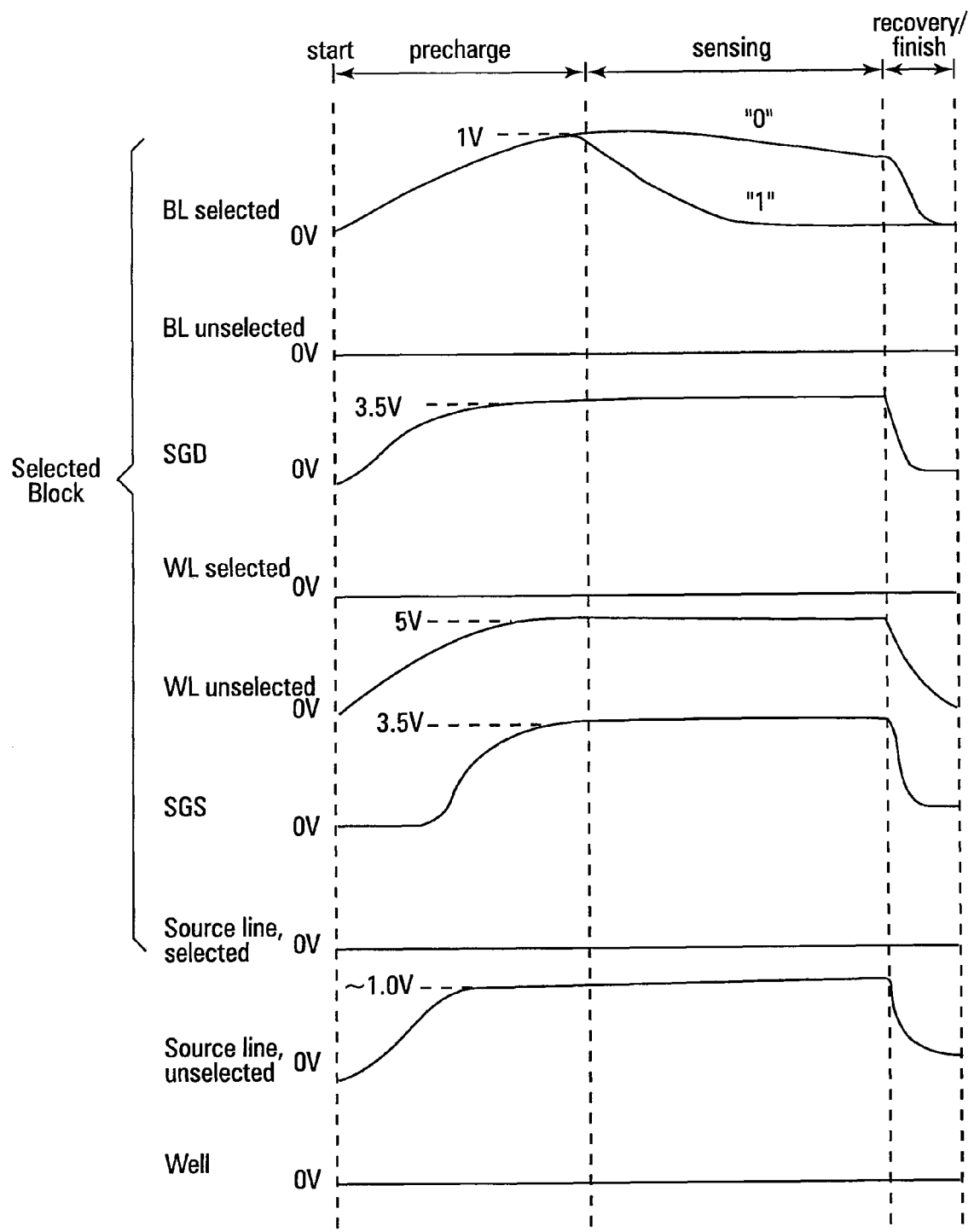
FIG. 5 is a timing diagram of a read operation in accordance with an embodiment of the invention.

FIG. 5 is a timing diagram of a read operation in accordance with an embodiment of the invention. During a precharge phase of the read operation of FIG. 5, selected bit lines BL are raised from a starting voltage, such as 0V or Vss to a first potential, such as 1V. Unselected bit lines BL are maintained at their ground potentials. The drain select gate control voltage SGD and the source select gate control voltage SGS for the selected block are brought up to a voltage expected to activate those select gates, e.g., Vcc or 3.5V. The selected word line WL of the selected block is maintained at the ground potential while unselected word lines WL of the selected block are brought up to a pass voltage, such as 5V. The source line associated with the selected block is maintained at a second potential, such as the ground potential, and the well or substrate in which the blocks of memory cells are formed is also maintained at the ground potential. Source lines not associated with the selected block are brought up to a third potential, such as 1V.

During a sensing phase, selected bit lines will experience a voltage change that is dependent upon the data value of a memory cell being read. For example, if a target memory cell has a first data value, or logic 1, such that it is activated in response to the voltage applied to the selected word line, the selected bit line will experience a larger voltage drop than if the target memory cell has a second data value, or logic 0, such that it is not activated in response to the voltage applied to the selected word line. The voltage drop on the selected bit lines can thus be used to determine the data values of their associated memory cells coupled to the selected word line. During a recovery or finish phase, the various node potentials are brought back to their starting values.

Figure 6:
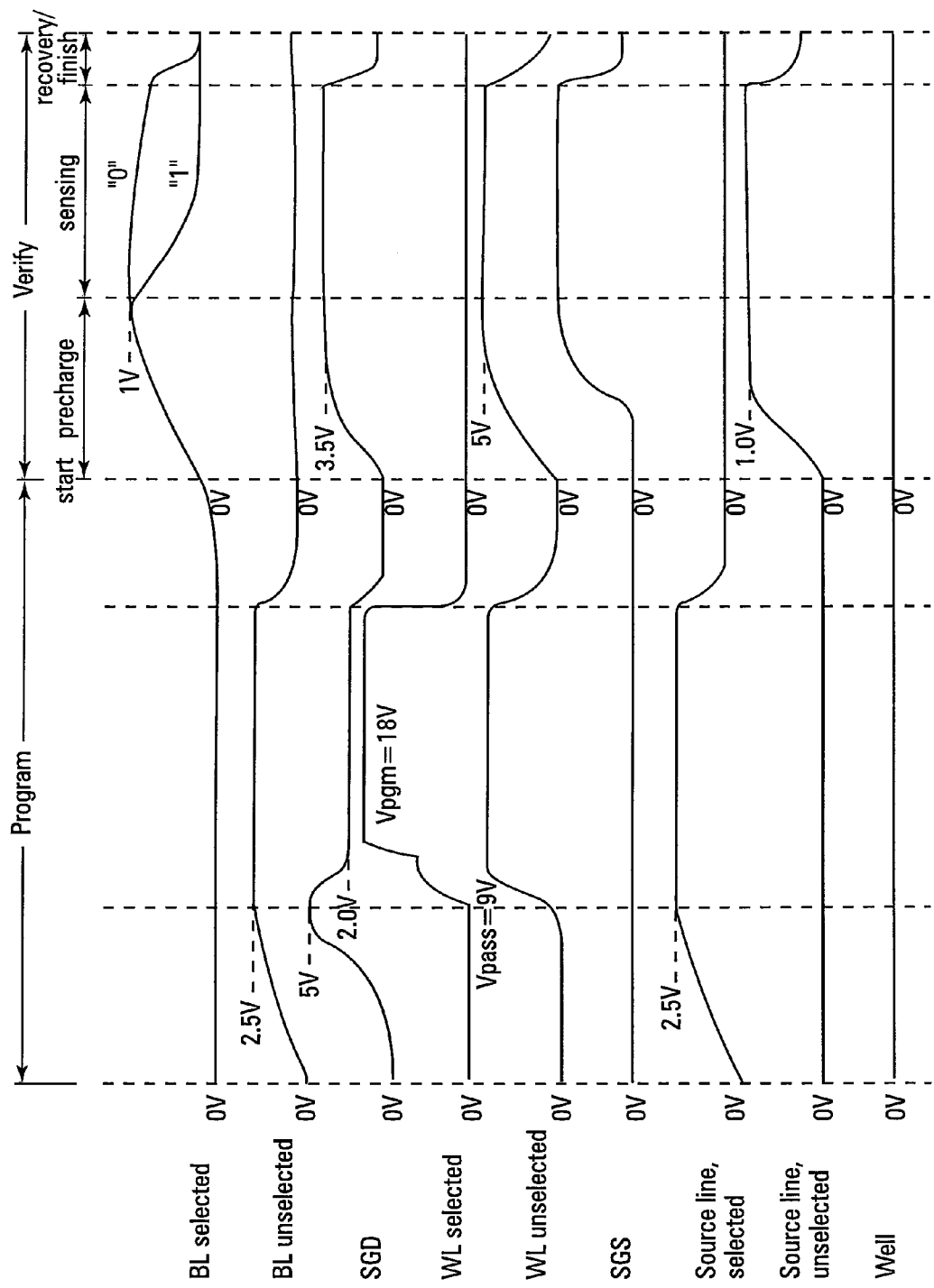
FIG. 6 is a timing diagram of a program/verify operation in accordance with an embodiment of the invention.

FIG. 6 is a timing diagram of a program/verify operation in accordance with an embodiment of the invention. In programming memory cells, it is generally desired to verify that the memory cells are programmed correctly. The programming operation is not a part of this invention, and thus will not be described in detail herein, but generally involves applying various voltages to bit lines, word lines and source lines to apply programming pulses to target memory cells to alter their threshold voltages.

The verify operation is a form of a read operation performed immediately after the programming operation. If data values of the target memory cells match their desired values, no further operation is required. However, if the data values of the memory cells do not match their desired values, the program/verify operation may be repeated until the values do match or a failure is declared. In FIG. 6, it is shown that the verify operation has precharge, sensing and recovery/finish phases tracking the read operation as described with reference to FIG. 5. Using varying voltages on selected and unselected source lines during a read operation as described in relation to various embodiments of the invention, power savings are facilitated and well bounce may be mitigated.

CONCLUSION

Non-volatile memory devices have been described utilizing a NAND architecture and adapted to perform read operations where a first potential is supplied to source lines associated with selected blocks of an array or memory cells and a second, different, potential is supplied to other source lines not associated with a selected block. By supplying a different potential to source lines of unselected blocks, current leakage can be mitigated. Furthermore, by reducing this type of undesirable leakage, select gate sizing and Vt may be reduced, thereby providing for increased array density and reduced power requirements.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of reading a target memory cell of a non-volatile memory device having two or more strings of series-coupled non-volatile memory cells, the method comprising:

applying a first potential to a first line selectively coupled to a string of series-coupled non-volatile memory cells containing the target memory cell;

applying a second potential to a second line selectively coupled to the first line through the string of series-coupled non-volatile memory cells containing the target memory cell;

applying a third potential to one or more third lines selectively coupled to the first line through one or more other strings of series-coupled non-volatile memory cells not containing the target memory cell, wherein the third potential has a value different than the second potential; and sensing a level of current flow between the first line and the second line to determine a data value of the target memory cell.

2. The method of claim 1, wherein applying the first potential to the first line comprises precharging the first line to the first potential.

3. The method of claim 1, wherein applying the third potential to one or more third lines comprises precharging the one or more third lines to the third potential, then allowing the one or more third lines to float while sensing the level of current flow between the first line and the second line to determine the data value of the target memory cell.

4. The method of claim 1, wherein sensing the level of current flow between the first line and the second line to determine the data value of the target memory cell comprises sensing a change in voltage level of the first line to determine the data value of the target memory cell.

5. The method of claim 4, wherein sensing the change in voltage level of the first line to determine the data value of the target memory cell comprises comparing a voltage level of the first line to a particular voltage level, determining the data value of the target memory cell to be a first data value if the voltage level of the first line falls below the particular voltage level and determining the data value of the target memory cell to be a second data value if the voltage level of the first line remains above the particular voltage level.

6. The method of claim 4, wherein applying the third potential comprises applying a potential at a level greater than or equal to the particular voltage level used to determine the data value of the target memory cell and less than or equal to a level of the first potential.

7. The method of claim 6, wherein applying the third potential further comprises applying a potential having a level closer to the particular voltage level used to determine the data value of the target memory cell than to the level of the first potential.

8. The method of claim 6, further comprising:
floating the one or more third lines while comparing the voltage level of the first line to the particular voltage level.

9. The method of claim 1, wherein applying the third potential comprises applying a potential at a level greater than a level of the second potential and less than or equal to a level of the first potential.

10. The method of claim 9, wherein applying the second potential comprises applying a ground potential and wherein applying the third potential comprises applying a positive potential less than or equal to the first potential.

11. A method of reading a target memory cell of a non-volatile memory device having two or more strings of series-coupled non-volatile memory cells, the method comprising:
precharging, to a first potential, a first line selectively coupled to a string of series-coupled non-volatile memory cells containing the target memory cell;
applying a second potential to a second line selectively coupled to the first line through the string of series-coupled non-volatile memory cells containing the target memory cell;
precharging, to a third potential, one or more third lines selectively coupled to the first line through one or more other strings of series-coupled non-volatile memory cells not containing the target memory cell, wherein the third potential has a level greater than a level of the second potential and less than or equal to a level of the first potential; and
sensing a change in voltage level of the first line to determine a data value of the target memory cell.

12. The method of claim 11, further comprising:
floating the one or more other third lines while sensing the change in voltage level of the first line to determine a data value of the target memory cell.

13. The method of claim 11, wherein sensing the change in voltage level of the first line to determine a data value of the target memory cell comprises determining the data value of the target memory cell to be a first data value if the voltage level of the first line falls below a particular voltage level and determining the data value of the target memory cell to be a second data value if the voltage level of the first line remains above the particular voltage level, wherein the particular voltage level is between the level of the first potential and the level of the second potential.

14. The method of claim 13, wherein applying the third potential comprises applying a potential at a level greater than or equal to the particular voltage level and less than or equal to the level of the first potential.

15. The method of claim 14, wherein applying the third potential further comprises applying a potential having a level closer to the particular voltage level than to the level of the first potential.

16. A method of reading a target memory cell of a non-volatile memory device having two or more strings of series-coupled non-volatile memory cells, the method comprising:
applying a first potential to a first line that is coupled to a source of a first select gate of one or more first select gates, wherein the one or more first select gates are coupled in series between a first string of series-coupled non-volatile memory cells containing the target memory cell and the first line, and wherein one non-volatile memory cell of the first string of series-coupled non-volatile memory cells is coupled to a drain of one of the first select gates;
applying a second potential to a second line that is coupled to a drain of a second select gate of one or more second select gates, wherein the one or more second select gates are coupled in series between the first string of series-coupled non-volatile memory cells and the second line, and wherein one non-volatile memory cell of the first string of series-coupled non-volatile memory cells is coupled to a source of one of the second select gates;
applying a third potential to one or more third lines selectively coupled to the first line through one or more second strings of series-coupled non-volatile memory cells and not selectively coupled to the first string of series-coupled non-volatile memory cells, wherein the third potential has a value different than the second potential; and
sensing a level of current flow through the first string of series-coupled non-volatile memory cells to determine a data value of the target memory cell.

17. The method of claim 16, wherein applying the third potential comprises applying a potential at a level between the second potential and the first potential.

18. The method of claim 17, wherein applying the third potential comprises applying a potential equal to the first potential.

19. The method of claim 16, wherein applying the second potential comprises applying a ground potential and wherein applying the third potential comprises applying a positive potential less than or equal to the first potential.

20. The method of claim 16, wherein sensing the level of current flow through the first string of series-coupled non-volatile memory cells to determine the data value of the target memory cell comprises comparing a voltage level of the first line to a particular voltage level, determining the data value of the target memory cell to be a first data value if the voltage level of the first line falls below the particular voltage level and determining the data value of the target memory cell to be a second data value if the voltage level of the first line remains above the particular voltage level.

21. The method of claim 20, wherein applying the third potential comprises applying a potential at a level greater than or equal to the particular voltage level used to determine the data value of the target memory cell.

22. The method of claim 21, wherein applying the third potential comprises applying a potential at a level greater than or equal to the particular voltage level used to determine the data value of the target memory cell and less than or equal to the first potential.

23. The method of claim 22, wherein applying the third potential further comprises applying a potential having a level closer to the particular voltage level used to determine the data value of the target memory cell than to the first potential.

24. The method of claim 16, further comprising:
wherein applying the first potential to the first line comprises applying the first potential to the first line that is coupled to the source of a first one of two first select gates, wherein one non-volatile memory cell of the first string of series-coupled non-volatile memory cells is coupled to the drain of a second one of the two first select gates, and wherein a drain of the first one of the two first select gates is coupled to a source of the second one of the two first select gates; and
wherein applying the second potential to the second line comprises applying the second potential to the second line that is coupled to the drain of a first one of two second select gates, wherein one non-volatile memory cell of the first string of series-coupled non-volatile memory cells is coupled to the source of a second one of the two second select gates, and wherein a source of the first one of the two second select gates is coupled to a drain of the second one of the two second select gates.

* * * * *

UNITED STATES PATENT AND TRADEMARK OFFICE
CERTIFICATE OF CORRECTION

PATENT NO. : 7,889,561 B2
APPLICATION NO. : 12/582289
DATED : February 15, 2011
INVENTOR(S) : Seiichi Aritome et al.

It is certified that error appears in the above-identified patent and that said Letters Patent is hereby corrected as shown below:

In column 12, line 6, in Claim 24, delete "of" and insert -- of the --, therefor.

In column 12, line 15, in Claim 24, delete "of" and insert -- of the --, therefor.

Signed and Sealed this
Nineteenth Day of April, 2011

David J. Kappos
*Director of the United States Patent and Trademark Office*